July 19, 1966 D. L. FREDRICKSON 3,262,065

TWO POLARITY AUTOMATICALLY VARIABLE AUDIO NOISE LIMITER

Filed Dec. 31, 1962

INVENTOR.
DENNIS L. FREDRICKSON

BY Moody and Kintzinger
ATTORNEYS

United States Patent Office 3,262,065
Patented July 19, 1966

3,262,065

TWO POLARITY AUTOMATICALLY VARIABLE AUDIO NOISE LIMITER

Dennis L. Fredrickson, Cedar Rapids, Iowa, assignor to Collins Radio Company, Cedar Rapids, Iowa, a corporation of Iowa Filed Dec. 31, 1962, Ser. No. 248,665
10 Claims. (Cl. 330—24)

Figure 1:
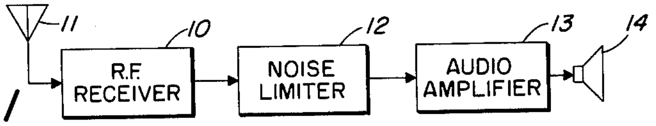

This invention relates in general to two polarity audio noise limiters, and in particular to an audio noise limiter having a variable clipping level for both polarities of the detected envelope which varies for both polarities substantially at the audio rate and substantially at, or closely above, the audio level.

Noise generally of a random nature, and usually occurring in pulsed form, is often superimposed on received amplitude modulated signals and may even be a problem with detected audio out of a single side band receiver. Diode limiting, or clipping, circuits have been used for limiting peak-to-peak voltage of a wave form to a given magnitude and to clip noise pulses tending to exceed the given magnitude. In some of these circuits, diodes are in parallel with the input circuit and are biased to conduction when peak input voltage exceeds the biased voltage construction threshold level for the diodes. This prevents output voltage from exceeding a given predetermined voltage level regardless of further increases in peak signal input magnitude and noise excursions in the input signal. Some RC networks have been employed in limiter circuits for obtaining a variable clipping level. However, these limiters are, generally, of a complex nature and relatively expensive.

It is, therefore, a principal object of the invention to provide two polarity audio noise limiting with automatically variable noise clipping levels closely approximating the detected envelope at substantially the audio rate.

A further object is to provide two polarity audio noise limiting with variable noise clipping levels controlled at substantially the audio rate by the audio output signal.

Another object is to provide removal of substantially all noise signal extensions beyond the envelope of a noise modulated carrier wave by automatic adjustment of noise limiting to audio rate variations in the input signal strength.

Features of this invention useful in accomplishing the above objects, in a two polarity automatically variable audio noise limiter circuit, include an audio input coupling resistor and capacitor, a diode limiting circuit with unlike terminals of first and second diodes coupled to the input, with the diodes connected between a voltage reference source and ground, and with voltage dropping resistors connected in shunt with the first and second diodes, respectively. The emitter of a transistor is connected to the diode limiting circuit as the voltage reference source and the transistor collector to a voltage supply. This transistor voltage reference source is subject to variations, in accordance with the voltage potential applied to its base, to vary the voltage levels developed across the voltage dropping resistors. The audio signal is coupled from the diode limiting circuit to a transistor amplifier. At least a portion of the output of the transistor amplifier is passed to a rectifier for developing a varying D.C. voltage potential, applied as an audio rate varying biasing voltage to the base of the voltage reference transistor for developing the required variable voltage reference at its emitter. Obviously, suitable components, capacitors, resistors and other elements, must be properly selected for circuit time constant characteristics consistent with variation of limiter noise clipping levels at substantially the audio rate.

Specific embodiments representing what are presently regarded as the best modes for carrying out the invention are illustrated in the accompanying drawings.

Figure 2:
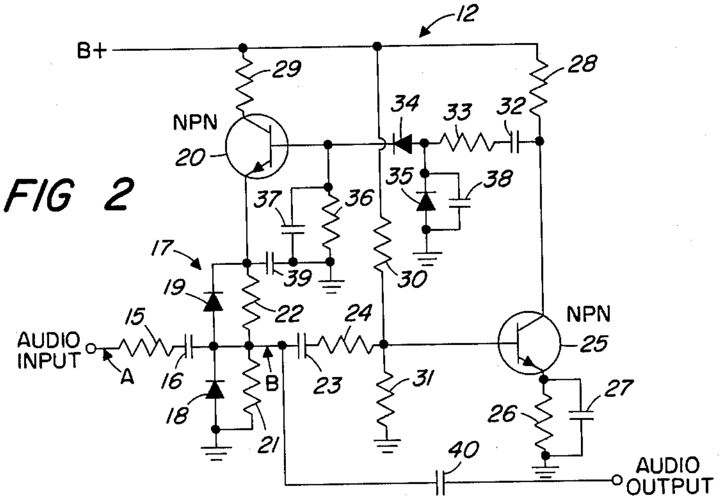
Figure 3A:
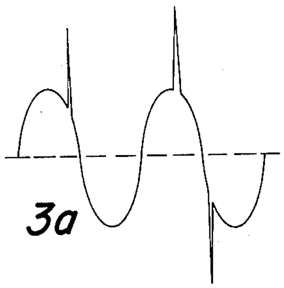
Figure 3B:
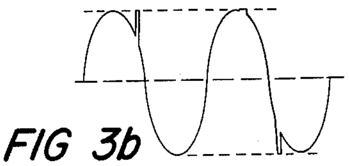
Figures 4, 5:
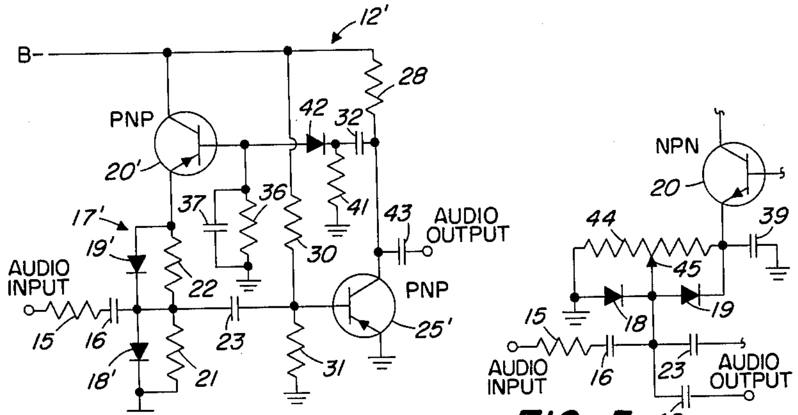

In the drawings:

FIGURE 1 represents a radio receiver equipped with a noise limiter and providing an audio output;

FIGURE 2, a detailed schematic of a noise limiting circuit which may be used as the noise limiter of FIGURE 1;

FIGURES 3A and 3B, the input wave form at point "A" of the noise limiter of FIGURE 2, and a wave form with clipped noise pulses at point "B" of FIGURE 2, respectively;

FIGURE 4, a detailed schematic of another noise limiter embodiment; and

FIGURE 5, a partial schematic view showing an alternate diode and shunt resistance limiting circuit embodiment.

Referring to the drawings:

The radio receiver 10 of FIGURE 1 receives an RF signal from antenna 11 and the detected audio output from receiver 10 is fed to noise limiter 12. The output of noise limiter 12 is passed to audio amplifier 13 and through the amplifier to speaker 14.

The audio input signal to the noise limiter 12 of FIGURE 2 is applied through input coupling resistor 15 and capacitor 16 to diode limiting, or clipping, circuit 17. This diode limiting circuit 17 includes a first diode 18 connected anode to ground and a second diode 19 connected anode to the cathode of diode 18 and cathode to the emitter of NPN transistor and at the junction of the cathode of diode 18 and the anode of diode 19 to capacitor 16. Diode limiting circuit 17 also includes two resistors 21 and 22 serially connected between ground and the emitter of transistor 20, and in shunt with diodes 18 and 19, respectively, by connection at their common junction with the common junction of diodes 18 and 19.

The audio signal is subsequently passed through capacitor 23 and resistor 24 to the base of audio signal amplifier NPN transistor 25. The emiter of transistor 25 is connected through resistor 26 and capacitor 27 in parallel to ground, and the collector is connected through resistor 28 to the B+ voltage supply. B+ is also connected through resistor 29 to the collector of transistor 20; and serially through resistors 30, and 31 to ground and at the junction of resistors 30 and 31 to the base of transistor 25 for proper voltage biasing of transistor 25.

The collector of transistor 25 is coupled to pass audio through capacitor 32 and resistor 33 to the junction of the anode of diode 34 and the cathode of diode 35. The cathode of diode 34 is connected to the base of transistor 20 and through resistor 36 and capacitor 37 in parallel to ground. Diodes 34 and 35, with diode 35 connected anode to ground and cathode to the anode of diode 34 and with capacitor 38 connected in parallel with diode 35, act as a voltage doubling and rectifying circuit both changing the A.C. signal input to D.C. and increasing D.C. potential applied to the base of transistor 20 as a function of and in direct proportion to the A.C. signal strength output of transistor 25. The emitter of transistor 20 is connected through capacitor 39 to ground in addition to the connection with diode limiting circuit 17.

Various components, including capacitors 32, 37, 38, and 39, and resistors 33 and 36 are carefully selected for circuit time constant characteristics consistent with variation of the voltage applied to the base of transistor 20 at substantially the audio rate. The audio output of the limiter is shown to be taken from the common junction between capacitors 16 and 23, and of the diode limiting circuit 17, and passed through capacitor 40 to an audio output terminal. Should it be desired that the noise limiter also perform an audio amplifying function, the audio output could be taken from the collector of NPN transistor 25.

In operation, the D.C. voltage potential applied as a biasing voltage to the base of transistor 20 varies with audio signal variation and acts to maintain a similarly varying voltage potential at the emitter. The voltage potential difference between the emitter and the base is relatively small and substantially only that required for biasing the transistor to conduction. Thus, the voltage potential of the emitter of transistor 20 is a voltage reference source for the diode limiting circuit 17 varying generally with variation of the D.C. potential applied to the transistor base. This may be subject to modification imposed with slight voltage variation from charging and discharging time constant characteristics of capacitor 39 associated with the diode limiting circuit 17. This results in various voltage values being developed across resistors 22 and 21 with the voltage at the junction of resistor 22 and the emitter of transistor 20 being the largest voltage and the voltage potential at the junction of resistors 21 and 22 being substantially one-half the largest voltage. Diodes 18 and 19, having been chosen for relatively low bias requirements in firing to conduction characteristics, are biased to conduction by the input signal only when, on the positive side, the potential of the signal exceeds by the required bias the potential of the cathode of diode 19, and, on the minus side, when the potential of the signal is enough lower than ground to provide the bias required to fire diode 18. It should be noted that when the noise limiter is in the dormant state with no audio input, it is ready to start noise limiting or clipping at a very low signal level should audio input start that includes noise pulses or other input signals with power levels increasing at a rate faster than the audio rate.

A signal input including noise pulses at point "A" of FIGURE 2, and as shown in FIGURE 3A, undergoes noise limiting or clipping in diode limiting circuit 17 to give, at point "B" in FIGURE 2, the resulting signal wave form with clipped noise pulses indicated in FIGURE 3B. The self-adjusting clipping levels of this noise limiter follow the audio envelope and adjust to various signal strength levels at substantially the audio rate. Generally, noise pulses or sharp signal excursions, extending beyond the audio signal envelope by substantially the bias required for firing the respective diodes, are clipped.

Components used in a noise limiting circuit, as shown in FIGURE 2, include the following:

| | |
|---|---|
| Resistor **15** | 2.2K ohms. |
| Capacitor **16** | 15μf. |
| Diode **18** | 1N457. |
| Diode **19** | 1N457. |
| Transistor **20** | 2N706. |
| Resistor **21** | 1.2K ohms. |
| Resistor **22** | 1.2K ohms. |
| Capacitor **23** | 15μf. |
| Resistor **24** | 3.3K ohms. |
| Transistor **25** | 2N706. |
| Resistor **26** | 470 ohms. |
| Capacitor **27** | 33μf. |
| Capacitor **40** | 15μf. |
| Resistor **28** | 1K ohms. |
| Resistor **29** | 4.7K ohms. |
| Resistor **30** | 22K ohms. |
| Resistor **31** | 10K ohms. |
| Capacitor **32** | 15μf. |
| Resistor **33** | 470 ohms. |
| Diode **34** | 1N457. |
| Diode **35** | 1N457. |
| Resistor **36** | 10K ohms. |
| Capacitor **37** | 6.8μf. |
| Capacitor **38** | .01μf. |
| Capacitor **39** | 47μf. |
| B+ Supply | 20 volts. |

In the embodiment of FIGURE 4 components similar to those of FIGURE 2, are, for the sake of convenience, numbered the same. The audio input signal to audio noise limiter 12' of FIGURE 4 is applied through input coupling resistor 15 and capacitor 16 to diode limiting, or clipping, circuit 17'. In this circuit, however, diode 18' is connected cathode to ground and diode 19' is connected cathode to the anode of diode 18', and at the junction of the diodes to capacitor 16. The anode of diode 19' is connected to the emitter of PNP transistor 20'. Diode limiting circuit 17' also includes two resistors 21 and 22 connected between ground and the emitter of transistor 20', and in shunt with diodes 18' and 19', respectively, by connection at their common junction with the common junction of diodes 18' and 19'. The audio signal is subsequently passed through capacitor 23 to the base of audio signal amplifier PNP transistor 25'. The emitter of transistor 25' is connected to ground and the collector is connected through resistor 28 to the B— voltage supply. B— is also connected to the collector of transistor 20'; and serially through resistors 30 and 31 to ground, and at the junction of resistors 30 and 31 to the base of transistor 25' for proper voltage biasing of transistor 25'.

The collector of transistor 25' is coupled for feeding a portion of the amplified audio through capacitor 32 to the junction of resistor 41, connected to ground, and the cathode of diode 42. The anode of diode 42 is connected to the base of transistor 20', and through resistor 36 and capacitor 37 in parallel to ground. The capacitor 32, resistor 41, and diode 42 act as an A.C.-to-D.C. voltage recifier circuit changing the A.C. audio signal to D.C. applied at the base of transistor 20' as a function of, and in direct proportion to, the A.C. signal strength output of transistor 25'. This embodiment also performs an audio amplifying function with the audio output taken from the collector of PNP transistor 25' and passed through capacitor 43. Obviously, various components are selected for circuit time constant characteristics consistent with variation of the voltage applied to the base of transistor 20' at substantially the audio rate.

There are some changes in the embodiment of FIGURE 4 from the embodiment of FIGURE 2 such as the diode rectifying arrangement. However, this could be interchanged from one to another and further, the transistors are changed from NPN to PNP transistors. The diodes in the diode limiting circuit are reversed cathode to anode respectively and the voltage supply is a minus voltage supply in place of a positive voltage supply. Fundamentally, however, the operating results are substantially the same.

In the embodiment of FIGURE 5 components similar to those of FIGURE 2 are, for the sake of convenience, numbered the same and those portions of FIGURE 2 not reproduced are the same. In this embodiment a single resistor in the form of a potentiometer 44, having an adjustable tap 45, is connected between ground and the emitter of transistor 20. The tap 45, which may be adjusted to the resistive center of resistor 44, is connected to the common junction of diodes 18 and 19 and the common junction of capacitors 16 and 23. The adjustable tap 45 does provide, however, an adjustment for more efficient noise limiting or clipping of signals which may be partially distorted for any of various reasons. Operation of this unit in all other respects is the same as with the embodiment of FIGURE 2 and the additional adjustment feature may be readily adapted for use with other embodiments.

Whereas this invention is here illustrated and described with respect to several embodiments thereof, it should be realized that various changes may be made without departing from the essential contributions to the art made by the teachings hereof.

I claim:

1. A two polarity audio noise limiter having a variable clipping level for both polarities of the detected audio envelope with the clipping levels varying for both polarities substantially at the audio rate and substantially at the audio signal level, including: an audio signal input terminal; first and second diodes, each having a cathode and an anode, and having unlike poles coupled to said input terminal; first and second voltage dropping means connected in shunt with said first and second diodes, respectively; a first voltage reference source connected to the other pole of said first diode; a second voltage reference source connected to the other pole of said second diode; a first transistor coupled to the common junction of said first and second diodes and said first and second voltage dropping means; said first transistor having an output electrode; rectifying means coupled to said output electrode; a second transistor with a control electrode connected to said rectifying means, a second electrode connected to a voltage supply, and a third electrode connected to said other pole of the first diode as said first voltage reference source; output signal path circuit means from the common junction of said first and second diodes to an output terminal of said noise limiter for passing a signal output from said noise limiter; and including capacitive means and resistive means coupled between said control electrode of said second transistor and said second voltage reference source having circuit time constant characteristics providing variation of voltage applied to said control electrode of said transistor, and variation of voltage developed at the third electrode of said second transistor following signal variations at substantially the audio rate.

2. The audio noise limiter of claim 1, wherein said control electrode is the base, said second electrode is the collector, and said third electrode is the emitter of the transistor, comprising said second transistor; and with said emitter comprising said first voltage reference source connected to said other pole of the first diode.

3. The audio noise limiter of claim 2, wherein said transistors are NPN transistors; with said voltage supply being a positive voltage supply; and with the voltage developed at the emitter of said second transistor being said voltage reference source, and as said voltage reference source following variations in the positive voltage potential of the base, and spaced below said base potential by substantially only the required base to emitter bias required for firing to conduction.

4. The audio noise limiter of claim 2, wherein said transistors are PNP transistors with said voltage supply being a negative voltage supply; and with the voltage developed at the emitter of said second transistor being said voltage reference source, and as said voltage reference source following variations in the negative voltage potential of the base, and spaced above the base potential by substantially the required base to emitter bias required for firing to conduction.

5. The audio noise limiter of claim 1, wherein said first and second voltage dropping means are resistors of substantially equal value.

6. The audio noise limiter of claim 1, wherein said first and second voltage dropping means are the opposite portions of a potentiometer having an adjustable tap, with the opposite portions being between the potentiometer tap and the respective opposite ends of the potentiometer; and said potentiometer tap being connected to the common junction of said first and second diodes.

7. The audio noise limiter of claim 1, wherein said rectifying means is a diode A.C.-to-D.C. rectifying circuit.

8. The audio noise limiter of claim 1, wherein said rectifying means is a diode combination A.C-to-D.C. rectifying and voltage doubling circuit.

9. The audio noise limiter of claim 1, wherein both audio noise limiting and amplifying functions are performed, with the audio output terminal coupled to the output electrode of said first transistor.

10. The audio noise limiter of claim 1, wherein said audio signal input terminal is coupled to said noise limiter serially through resistive means and capacitive means; and the audio output of said noise limiter is passed through capacitive means to said output terminal.

References Cited by the Examiner

UNITED STATES PATENTS

| | | | |
|---|---|---|---|
| 2,144,995 | 1/1939 | Pulvari-Pulvermacher | 325—473 |
| 2,961,532 | 11/1960 | Rowley | 328—171 X |
| 3,041,535 | 6/1962 | Cohran. | |

ROY, LAKE, *Primary Examiner.*

NATHAN KAUFMAN, *Examiner.*